United States Patent
Tada et al.

(10) Patent No.: US 8,133,427 B2
(45) Date of Patent: Mar. 13, 2012

(54) PHOTO NANOIMPRINT LITHOGRAPHY

(75) Inventors: Yasuhiko Tada, Tokai (JP); Hiroshi Yoshida, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/190,607

(22) Filed: Aug. 13, 2008

(65) Prior Publication Data

US 2009/0085255 A1   Apr. 2, 2009

(30) Foreign Application Priority Data

Sep. 28, 2007   (JP) ................................. 2007-252973

(51) Int. Cl.
*B29C 35/04*   (2006.01)

(52) U.S. Cl. ......... 264/401; 264/319; 264/494; 264/496

(58) Field of Classification Search .................. 264/319, 264/401, 496, 494
See application file for complete search history.

(56) References Cited

U.S. PATENT DOCUMENTS

| | | | | |
|---|---|---|---|---|
| 2003/0087073 A1* | 5/2003 | Kobayashi | ................... | 428/209 |
| 2004/0065976 A1* | 4/2004 | Sreenivasan et al. | ...... | 264/171.1 |
| 2005/0159574 A1* | 7/2005 | Jin | ................................. | 528/42 |
| 2005/0245630 A1* | 11/2005 | Narayan-Sarathy et al. | ... | 522/71 |
| 2007/0167023 A1* | 7/2007 | Yamazaki et al. | ............ | 438/717 |

FOREIGN PATENT DOCUMENTS

| | | |
|---|---|---|
| JP | 2004-304097 | 10/2004 |
| JP | 2005-533393 | 11/2005 |
| WO | WO 2004/016406 A1 | 2/2004 |

* cited by examiner

*Primary Examiner* — Khanh P Nguyen
*Assistant Examiner* — Margaret Squalls
(74) *Attorney, Agent, or Firm* — Antonelli, Terry, Stout & Kraus, LLP.

(57) ABSTRACT

The present invention is directed to providing a photo nanoimprint lithography which can form a more uniform base layer. A photo nanoimprint lithography according to the present invention includes the steps of discretely applying a photo-curable resist drop-wise onto a substrate, filling an asperity pattern of a mold with the photo-curable resist by bringing the mold having the asperity pattern formed therein into contact with the photo-curable resist, curing the photo-curable resist by irradiating the resist with a light and releasing from the mold the photo-curable resist which has been photo-cured, wherein an intermediary layer is formed on a surface of the substrate for maintaining a discrete placement of the photo-curable resist that has been instilled drop-wise on the substrate until the mold is brought into contact with the photo-curable resist that has been instilled drop-wise on the substrate.

11 Claims, 8 Drawing Sheets

Pressurization/Curing

FIG. 5
(a)
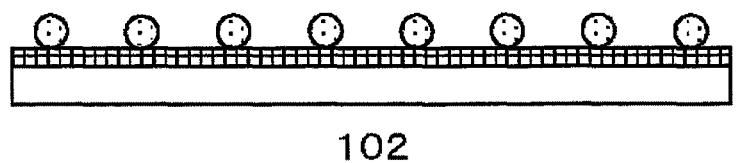
102
(b)
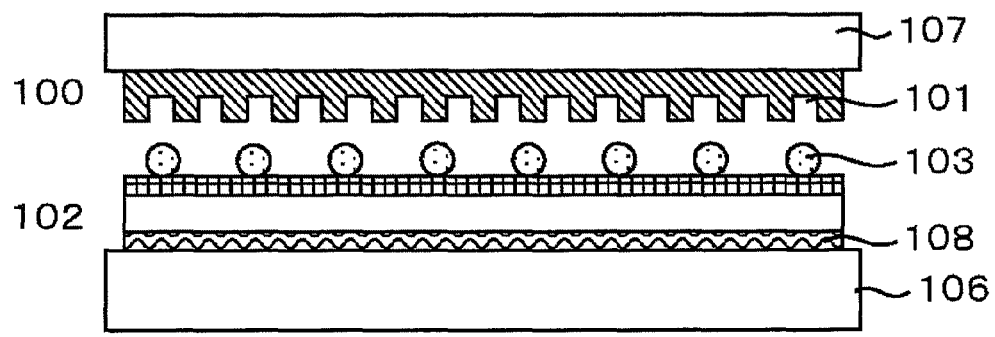
(c)
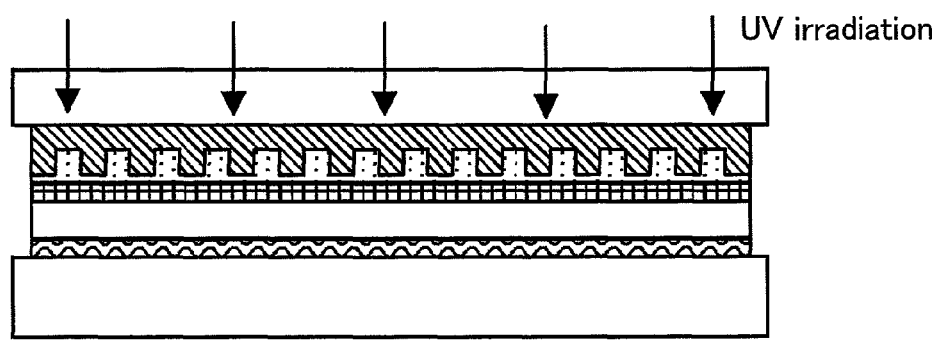
UV irradiation
(d)
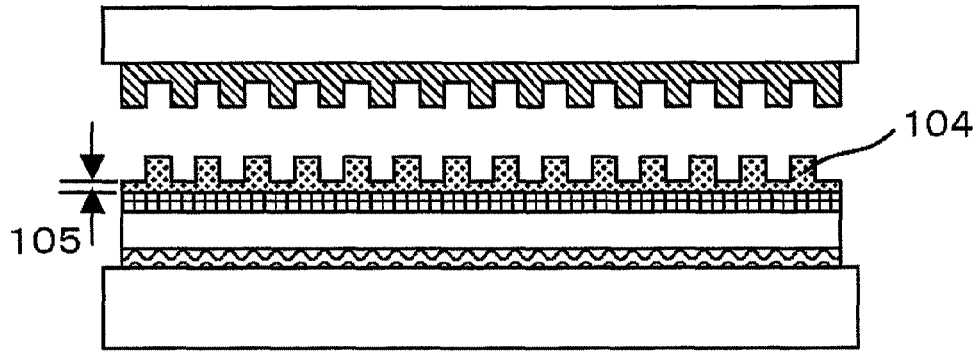

PHOTO NANOIMPRINT LITHOGRAPHY

BACKGROUND OF THE INVENTION

1. Field of the Invention

The present invention relates to photo nanoimprint lithography of transferring a surface geometry of a mold onto a surface of a substrate.

2. Background Art

Network technology, software technology and device technology are needed to further develop due to the tendency of recent advances in information technology. To a semiconductor integrated circuit, in particular, such a high technology is required that the circuit is further refined and integrated, consequently is operated at a higher speed and is operated with low power consumption. Currently, photolithography is shifted from KrF laser lithography having the minimum line width of 130 nm to ArF laser lithography having higher resolution. However, the minimum line width of ArF laser lithography is 100 nm at a mass production level, whereas a device having the minimum line width of 45 nm is starting to be manufactured in the year 2007. In such a situation, technologies expected as a further refining technique include F2 laser lithography, extreme ultraviolet lithography, electron beam reduced projection lithography and X-rays lithography. However, as a finer patterning technology progresses, an initial cost of the exposure device itself exponentially increases, and besides there is a problem that the price of a mask for obtaining the same level of resolution as that of the wavelength of a used light rapidly rises.

As technology for coping with the problem, there is imprint lithography of forming a fine pattern. Imprint lithography is technology that transfers a predetermined pattern onto a substrate by pressing a mold having the same asperities as a pattern which is desired to be formed on the substrate against a surface of the substrate or a resin on the substrate, and then by releasing the mold, and that can simply and easily form a fine structure having a width between the asperities of 50 nm or less, though being inexpensive. For this reason, it has been investigated to apply the imprint technique to fields of forming a recording bit on a high-capacity recording medium, forming a pattern of a semiconductor integrated circuit, or the like.

Nanoimprint lithography is roughly classified into two types according to a material to be transferred therein. One is thermal nanoimprint lithography of heating the material to be transferred therein, plastically deforming the material with the mold and cooling the material to form a pattern. The other is photo-nanoimprint lithography of applying liquid photo-curable resist to substrate at room temperature, pressing an optically transparent mold to the resist, irradiating the resist with a light to cure the resist on the substrate, and consequently forming the pattern. In particular, the photo-nanoimprint lithography can form patterns at room temperature, accordingly hardly causes distortion due to the difference in linear expansion coefficient caused by heat between the substrate and the mold, can form a pattern of high precision, and receives attention as an alternative technique of a lithographic technology for a semiconductor or the like.

In a transferred pattern with fine asperities being formed when a photo-curable resist is cured, a base layer of the photo-curable resist is formed in its recess part. In order to transfer the fine asperity pattern onto the substrate, the base layer is usually removed by a dry etching technique, a wet etching technique or the like. In order to transfer the fine asperity pattern onto the substrate with high accuracy, it is required to uniformize a film thickness of the base layer and thin a film of the base layer on the surface to be transferred onto.

Conventionally, a countermeasure of increasing a pressing force in pressing the mold or the like has been taken as means for thinning the film of the base layer of the photo-curable resist, but has had a problem of occasionally causing a fracture of the mold because a large force is applied to the mold when the pressure is increased.

In order to solve such a problem, JP Patent Publication (Kokai) No. 2004-304097A proposes the following transfer method. The transfer method specifically provides a polymer film for controlling the reaction of a photo-curable resist on the surface of the projecting parts of the mold. The polymer film for controlling the reaction of photo-curable resist is a polymer having a function of blocking or absorbing a light having a wavelength of a light source to be used for a photo-curing reaction. When the mold having this polymer film for controlling the reaction of photo-curable resist is used in a transferring operation, the photo-curing reaction does not proceed in the photo-curable resist right under the polymer film for controlling the reaction of photo-curable resist, so that the transferred film free from the base layer can be formed by cleaning an uncured photo-curable resist.

In addition, JP Patent Publication (Kohyo) No. 2005-533393A proposes a method of applying a photo-curable resist with the use of an ink-jet technique. The method with the use of the ink-jet technique can specify positions of the droplets of the resist and discretely apply the resist onto the substrate, and accordingly can control the distribution of film thickness, because the droplets are uniformly spread when the mold has been pressed onto the droplets.

SUMMARY OF THE INVENTION

The method according to JP Patent Publication (Kokai) No. 2004-304097A can form a transferred film free from a base layer, but has such a problem left that the reaction of the resist cannot be controlled sometime because the polymer film for controlling the reaction of photo-curable resist deteriorates along with the transfer operation.

On the other hand, the method according to JP Patent Publication (Kohyo) No. 2005-533393A does not cause the problem that the polymer film for controlling the reaction of the photo-curable resist deteriorates. However, the photo-curable resist is required to have easily flowable properties so as to be uniformly filled in fine asperity pattern of the mold. When the resist is discretely applied onto the substrate by an ink-jet technique or the like, the droplets spread on the substrate and aggregate with each other. As a result, there is a case where the distribution of film thickness is hardly controlled.

The present invention has been made in consideration of the above described problems, and is directed to providing a photo nanoimprint lithography which can form a more uniform base layer.

A photo nanoimprint lithography according to the present invention includes the steps of discretely applying a photo-curable resist drop-wise onto a substrate, filling an asperity pattern of a mold with the photo-curable resist by bringing the mold having the asperity pattern formed therein into contact with the photo-curable resist, curing the photo-curable resist by irradiating the resist with a light and releasing from the mold the photo-curable resist which has been photo-cured, wherein an intermediary layer is formed on a surface of the substrate for maintaining a discrete placement of the photo-curable resist that has been instilled drop-wise on the substrate until the mold is brought into contact with the photo-curable resist that has been instilled drop-wise on the substrate.

The photo nanoimprint lithography also includes forming an intermediary layer which has a larger interfacial tension than the surface tension of the photo-curable resist, or shows a larger contact angle against water than that of the surface of the substrate, on the surface of the substrate.

A photo nanoimprint lithography according to the present invention has an intermediary layer formed on a surface of a substrate, and thereby can imprint the pattern while making few resist droplets that have been discretely applied onto the substrate by an ink-jet technique aggregate with each other, and can form a uniform base layer. The photo nanoimprint lithography also can enhance the processing accuracy of a geometry of a servo pattern when applied to a recording medium, and accordingly can improve positioning characteristics of a head in a magnetic disc unit (HD).

BRIEF DESCRIPTION OF THE DRAWINGS

FIG. 5 is a schematic view illustrating a nanoimprint process in Example 1.

| Description of Symbols | |
|---|---|
| 100, 210 | mold |
| 101 | section for forming asperity geometry |
| 102, 201, 501 | substrate |
| 102a, 208a | section for forming intermediary layer |
| 102b | backing substrate |
| 103, 104, 209 | resist |
| 105 | base layer |
| 106 | lower stage |
| 107 | upper stage |
| 108 | buffer layer |
| 200 | magnetic recording medium |
| 202 | hole |
| 203 | recording track |
| 204 | servo pattern |
| 205 | outer circumference |
| 206 | inner circumference |
| 207 | soft magnetic underlayer |
| 208 | recording layer |
| 211 | cured resist |
| 212 | non-magnetic material |
| 213 | protection film |
| 500 | optical circuit |
| 502 | transmission unit |
| 503, 503' | optical waveguide |

DETAILED DESCRIPTION OF THE PREFERRED EMBODIMENTS

This application is based on the Japanese patent application JP2007-252973, all the contents of which is incorporated in this application by reference.

Figure 1:
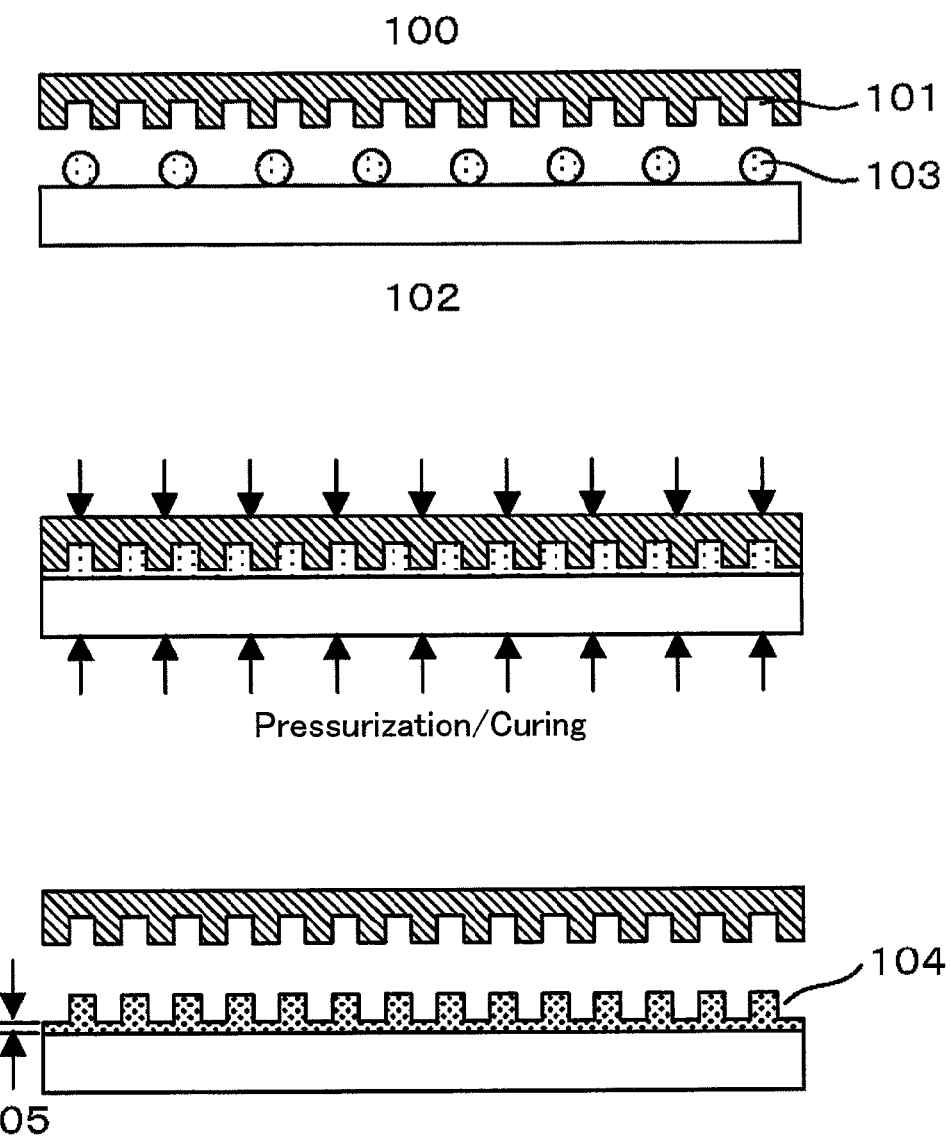
FIG. 1 is a schematic view illustrating a nanoimprint process.
Figure 2:
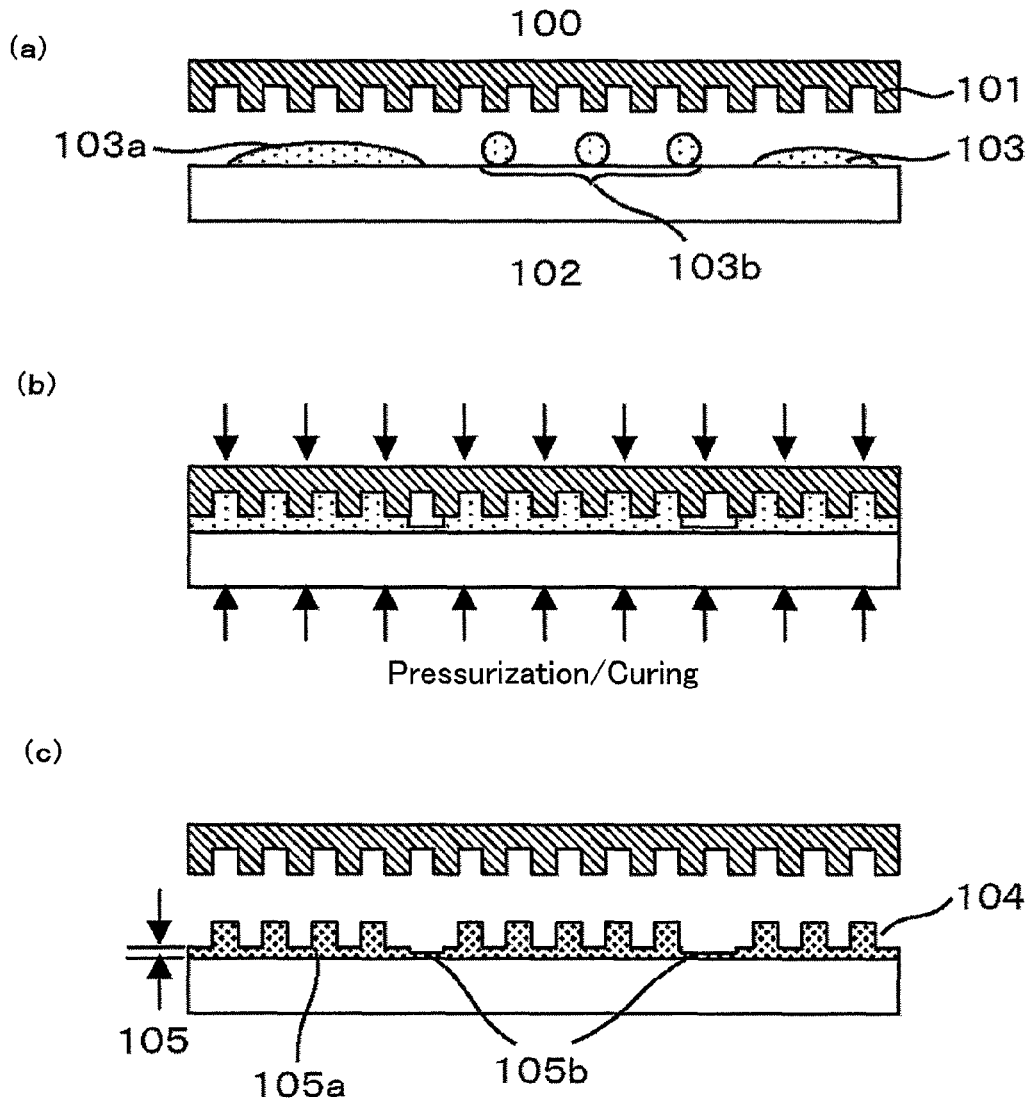
FIG. 2 is a schematic view illustrating a nanoimprint process when droplets have aggregated.

Next, embodiments according to the present invention will now be described below with reference to the drawings as appropriate. FIG. 1 illustrates a concept of a photo-nanoimprint process. A resist 103 is discretely disposed on a substrate 102, is pressurized with a section 101 of a mold 100 for forming an asperity geometry to be spread out and be filled in the asperities of the mold 100, and is cured. Subsequently, the mold 100 is released from the resist, and a resist 104 can be obtained which has the same geometry as the section 101 for forming the asperity geometry. However, when a region 103a formed by the aggregation of the droplets exists in the resist 103 disposed on the substrate 102 as is illustrated in FIG. 2, the distribution of thickness (105a and 105b) of a base layer 105 tends to be easily formed, as is illustrated in FIG. 2(C).

Figure 3:
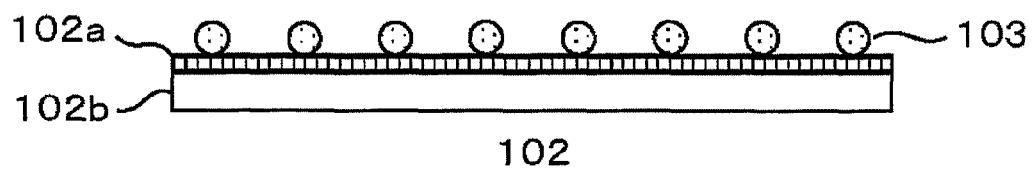
FIG. 3 is a schematic view illustrating an intermediary layer formed according to the present invention.

FIG. 3 is a schematic view illustrating a main part of a substrate 102 and a resist 103 according to the present embodiment. One part of the resist 103 which has been discretely arranged is combined with an adjacent resist 103. Then, the combination causes the distribution in the plane of the above described base layer 105. For this reason, an intermediary layer 102a is formed on an underlayer 102b on the substrate 102 as is illustrated in FIG. 3, in order to maintain the shape of the droplet of the resist.

Figure 4:
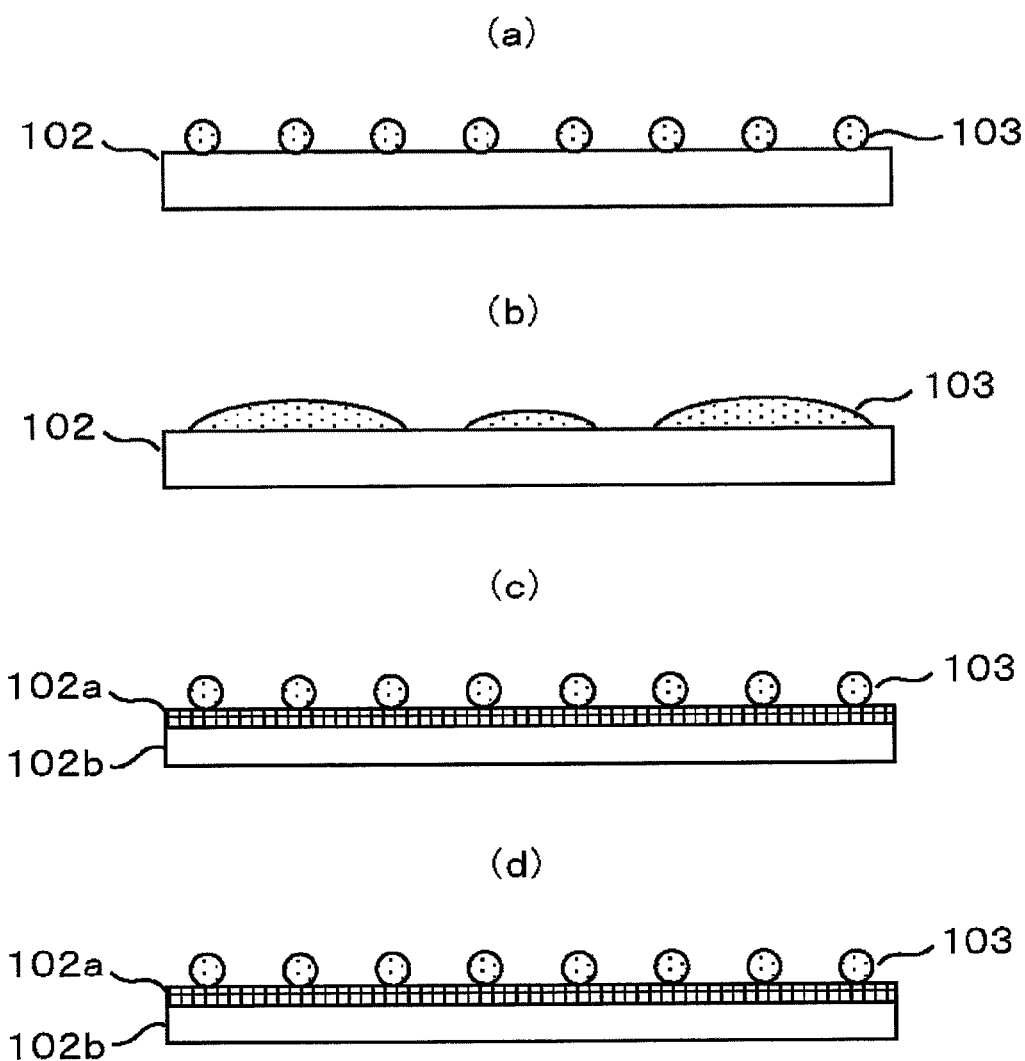
FIG. 4 is a schematic view illustrating an effect of an intermediary layer according to the present invention.

Next, a role of the intermediary layer 102a on the substrate 102 will now be described below with reference to FIG. 4. FIG. 4 is a view illustrating the states when a resist has been applied to a substrate 102, in a nanoimprint process. FIG. 4 illustrates only the substrate 102 and a resist 103 for the sake of description, and omits a mold 100 and a nanoimprint apparatus. FIGS. 4(A) and (B) illustrate the cases where the substrate does not have the intermediary layers 102a formed thereon, and FIGS. 4(C) and (D) illustrate the cases where the substrate has the intermediary layers 102a formed thereon. The resist 103 is disposed on the substrate 102 by a technique such as an ink-jet technique. When the substrate does not have the intermediary layer 102a formed thereon, the resist 103 spreads from the state of being disposed on the substrate 102 as is illustrated in FIG. 4(A) to the surface of the substrate while being wet as is illustrated in FIG. 4(B), and is shifted to the state in which adjacent droplets of the resist aggregate with each other. Thus, the droplets result in ununiformly spreading when being nanoimprinted. On the other hand, when the substrate has the intermediary layer 102a formed thereon, the droplet of the resist maintains the shape from the state in which the resist 103 has been disposed on the substrate 102 as is illustrated in FIG. 4(C) to the state as illustrated in FIG. 4(D). Here, it is supposed that the mold has sufficient flexibility and the resist 103 spreads to have the same geometry as the resist 104. In FIG. 4(B), an amount of the droplet increases at a part in which the resist aggregates with each other, so that a thicker base layer is formed in the above part than in a part in which the resist is discretely arranged. In FIG. 4(B), the droplet also spreads ununiformly, so that defects increase when the pattern has been imprinted. The phenomenon is the same one as illustrated in FIG. 2. On the other hand, the substrate in FIG. 4(D) has the intermediary layer 102a formed thereon, so that the droplet of the resist is discretely disposed without spreading out while being wet. The resist 103 uniformly spreads when the mold 100 is pressurized to the substrate 102, and can make the film thickness of a base layer 105 uniform when the pattern is imprinted.

Examples of a material of a mold 100 include, for instance, an inorganic substance such as quartz, glass and silicon, a metal such as nickel and various types of resins. The contour of the mold 100 may be any one of a circle, an ellipse and a polygon according to a pressurization method. The mold 100 may have a center hole formed therein. The mold 100, particularly the section 101 for forming the asperity geometry can have a releasing treatment film such as a fluorine-based film and a silicon-based film on the surface, so as to promote a releasing action of the mold 100 from the spread resist 104. Incidentally, the mold 100 needs to be transparent with respect to a wavelength of a light to be used for a reaction, because a photo-reactive substance is used as the resist 103. However, when a backing substrate 102 is transparent with respect to the wave length of the light to be used for the reaction and the resist can be cured by being irradiated with the light through the backing substrate, the mold 100 does not need to be transparent.

The section 101 on the mold 100 for forming the asperity geometry is formed by a well-known processing method according to a desired material and precision of the mold. The processing method can employ techniques including: for instance, a photolithography technique, a focused ion beam lithographic technique, an electron beam lithographic technique and mechanical techniques such as a cutting work; and replica production techniques such as a molding process from an original mold or a plating process.

Examples a material of the above described backing substrate 102b include, for instance, a material which is worked from various materials such as silicon, glass and an aluminum alloy. The backing substrate 102b may also be a multilayer structure having a metal layer, a resin layer, an oxide film layer or the like formed thereon. A contour of the substrate 102 may be any one of a circle, an ellipse and a polygon. The substrate 102 may have a center hole formed therein. Particularly when a substrate to be used has a contact angle of smaller than 30 degrees with respect to water, the present invention can provide its effect more.

A material for the above described intermediary layer 102a shall have a larger interfacial tension than the surface tension of a photo-curable resist so as to maintain the shape of the droplet of the resist. A preferable condition of the interfacial tension of the intermediary layer 102a can be relatively estimated from a magnitude of interfacial tension of the intermediary layer with respect to the surface tension of water. The magnitude of interfacial tension of the intermediary layer with respect to the surface tension of water can be obtained from a contact angle of the intermediary layer 102a against water. The material for the intermediary layer 102a shall have a larger contact angle against water than the contact angle of the backing substrate against water, in order to have a larger interfacial tension than the surface tension of the photo-curable resist. The intermediary layer 102a has the contact angle θ preferably of 30 degrees<θ<90 degrees against water. When the contact angle θ of the intermediary layer 102a against water is 30 degrees or less, the resist 103 tends to easily spread on the surface of the intermediary layer 102a while being wet, and aggregates with each other before the resist 103 is brought into contact with the mold 100. On the other hand, when the contact angle of the intermediary layer 102a against water is 90 degrees or more, the resist 103 hardly spreads when the resist 103 is pressed and extended by being brought into contact with the mold 100, which results in leaving an air gap between the resists 103.

The material for the intermediary layer 102a has also preferably high adhesion to the resist so that the resist cannot be released from the intermediary layer 102a when the pattern will be transferred. Thus, a functional group which the material of the intermediary layer 102a needs to have so as to enhance the adhesion to the resist is determined mainly by a desired interaction with a functional group provided on a resist material to be used in each case. Though depending on the functional group, for instance, a π-π interaction can be caused between the functional group of the intermediary layer and the functional group provided on the resist material. Alternatively, both functional groups can form a covalent bond as a result of a chemical reaction. Another suitable interaction is a dipole interaction. Examples of a suitable functional group include a phenyl group, an amino group, a carboxylate group, an acrylate group or a methacrylate group, for instance.

The above described intermediary layer 102a and backing substrate 102b preferably have the high adhesion between them so that the intermediary layer 102a is not peeled when the pattern will be transferred. Preferably, the intermediary layer 102a and the backing substrate 102b are fixed by a chemical bond. Preferably, the layers are fixed by a covalent bond.

Accordingly, examples of a preferable intermediary layer 102a include the group consisting of (poly)methacrylic acid, (poly)acrylates, (poly)methacrylates, (poly)acrylamides, (poly)methacrylamides, (poly)carbamides, (poly)olefins, (poly)styrene, (poly)amides, (poly)imides, a (poly)vinyl compound, (poly)esters, (poly)arylates, (poly)carbonates, (poly)ethers, (poly)ether ketones, (poly)sulfones, (poly)epoxides, fluoropolymers, organo-(poly)-siloxanes, (poly)siloxanes and hetero-(poly)-siloxanes, and preferably have a polymerizable functional group which polymerizes with the resist.

Preferably, a silane coupling agent contained in the above described intermediary layer or the polymer thereof is specifically a polymer which is a silane coupling agent represented by the following chemical formula, one or more hydrolytic condensate, or co-hydrolytic condensate.

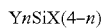 (Chemical Formula 1)

$Y_nSiX_{(4-n)}$ wherein Y represents an alkyl group, a fluoroalkyl group, a vinyl group, an amino group, a phenyl group, a chloroalkyl group, an isocyanate group, or an epoxy group or an organic group containing them; X represents an alkoxyl group, an acetyl group or a halogen; and n is an integer of 0 to 3. The alkoxyl group shown by X is preferably a methoxy group, an ethoxy group, a propoxy group or a butoxy group. In addition, the whole organic group shown by Y has preferably 1 to 20 carbon atoms, and particularly 5 to 10 carbon atoms.

Usable examples of the above described silane coupling agent specifically include: methyltrichlorosilane, methyltribromosilane, methyltrimethoxysilane, methyltriethoxysilane, methyltriisopropoxysilane, methyltri-t-butoxysilane, ethyltrichlorosilane, ethyltribromosilane, ethyltrimethoxysilane, ethyltriethoxysilane, ethyltriisopropoxysilane, ethyltri-t-butoxy silane, n-propyltrichlorosilane, n-propyltribromosilane, n-propyltrimethoxysilane, n-propyltriethoxysilane, n-propyltriisopropoxysilane, n-propyltri-t-butoxy silane, n-hexyltrichlorosilane, n-hexyltribromosilane, n-hexyltrimethoxysilane, n-hexyltriethoxysilane, n-hexyltriisopropoxysilane, n-hexyltri-t-butoxysilane, n-decyltrichlorosilane, n-decyltribromosilane, n-decyltrimethoxysilane, n-decyltriethoxysilane, n-decyltriisopropoxysilane, n-decyltri-t-butoxysilane; n-octadecyltrichlorosilane, n-octadecyltribromosilane, n-octadecyltrimethoxysilane, n-octadecyltriethoxysilane, n-octadecyltriisopropoxysilane, n-octadecyltri-t-butoxy silane, phenyltrichlorosilane, phenyltribromosilane, phenyltrimethoxysilane, phenyltriethoxysilane, phenyltriisopropoxysilane, phenyltri-t-butoxy silane, dimethoxydiethoxysilane, dimethyldichlorosilane, dimethyldibromosilane, dimethyldimethoxysilane, dimethyldiethoxysilane, diphenyldichlorosilane, diphenyldibromosilane, diphenyldimethoxysilane, diphenyldiethoxysilane, phenylmethyldichlorosilane, phenylmethyldibromosilane, phenylmethyldimethoxysilane, phenylmethyldiethoxysilane, trichlorohydrosilane, tribromohydrosilane, trimethoxyhydrosilane, triethoxyhydrosilane, triisopropoxyhydrosilane, tri-t-butoxyhydrosilane, vinyltrichlorosilane, vinyltribromosilane, vinyltrimethoxysilane, vinyltriethoxysilane, vinyltriisopropoxysilane, vinyltri-t-butoxy silane, γ-glycidoxy propylmethyldimethoxysilane, γ-glycidoxy propylmethyldiethoxysilane, γ-glycidoxypropyltrimethoxysilane, γ-glycidoxypropyl triethoxysilane, γ-glycidoxypropyltriisopropoxysilane, γ-glycidoxypropyltri-t-butoxysilane, γ-methacryloxypropylmethyldimethoxysilane, γ-methacryloxypropylmethyldiethoxysilane, γ-methacryloxypropyltrimethoxysilane, γ-methacryloxypropyltriethoxysilane, γ-methacryloxypropyltriisopropoxysilane, γ-methacryloxypropyltri-t-butoxysilane, γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri-t-butoxysilane, γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyltri-t-butoxysilane, β-(3,4-epoxycyclohexyl)ethyltrimethoxysilane, β-(3,4-epoxycyclohexyl) ethyltriethoxysilane, a partial hydrolysate thereof and a mixture thereof.

Examples of a compound containing the fluoroalkyl group include the following compounds, and a substance generally known as a fluorine-based silane coupling agent may be used.

$CF_3(CF_2)_3CH_2CH_2Si(OCH_3)_3$
$CF_3(CF_2)_5CH_2CH_2Si(OCH_3)_3$
$CF_3(CF_2)_7CH_2CH_2Si(OCH_3)_3$
$CF_3(CF_2)_9CH_2CH_2Si(OCH_3)_3$
$(CF_3)_2CF(CF_2)_4CH_2CH_2Si(OCH_3)_3$
$(CF_3)_2CF(CF_2)_6CH_2CH_2Si(OCH_3)_3$
$(CF_3)_2CF(CF_2)_8CH_2CH_2Si(OCH_3)_3$
$CF_3(C_6H_4)C_2H_4Si(OCH_3)_3$
$CF_3(CF_2)_3(C_6H_4)C_2H_4Si(OCH_3)_3$
$CF_3(CF_2)_5(C_6H_4)C_2H_4Si(OCH_3)_3$
$CF_3(CF_2)_7(C_6H_4)C_2H_4Si(OCH_3)_3$
$CF_3(CF_2)_3CH_2CH_2SiCH_3(OCH_3)_2$
$CF_3(CF_2)_5CH_2CH_2SiCH_3(OCH_3)_2$
$CF_3(CF_2)_7CH_2CH_2SiCH_3(OCH_3)_2$
$CF_3(CF_2)_9CH_2CH_2SiCH_3(OCH_3)_2$
$(CF_3)_2CF(CF_2)_4CH_2CH_2SiCH_3(OCH_3)_2$
$(CF_3)_2CF(CF_2)_6CH_2CH_2SiCH_3(OCH_3)_2$
$(CF_3)_2CF(CF_2)_8CH_2CH_2SiCH_3(OCH_3)_2$
$CF_3(C_6H_4)C_2H_4SiCH_3(OCH_3)_2$
$CF_3(CF_2)_3(C_6H_4)C_2H_4SiCH_3(OCH_3)_2$
$CF_3(CF_2)_5(C_6H_4)C_2H_4SiCH_3(OCH_3)_2$
$CF_3(CF_2)_7(C_6H_4)C_2H_4SiCH_3(OCH_3)_2$
$CF_3(CF_2)_3CH_2CH_2Si(OCH_2OCH_3)_3$
$CF_3(CF_2)_5CH_2CH_2Si(OCH_2OCH_3)_3$
$CF_3(CF_2)_7CH_2CH_2Si(OCH_2OCH_3)_3$
$CF_3(CF_2)_9CH_2CH_2Si(OCH_2OCH_3)_3$
$CF_3(CF_2)_7SO_2N(C_2H_5)C_2H_4CH_2Si(OCH_3)_3$

Examples of a method for preparing the above described intermediary layer 102a include a spin coating method, a dipping method or a gas-phase vapor deposition method. When the above described intermediary layer is formed of only a silane coupling agent or a polymer thereof, the intermediary layer can be prepared by dispersing the above described material in a solvent or the like as needed, and applying the liquid onto a substrate with a well-known method such as a spin coating method, a spray coating method, a dip coating method, a roll coating method and a bead coating method.

The thickness of an intermediary layer 102a should be determined so as to be relatively commensurate with the etching resistance of the resist and the thickness of a base layer. However, when a height of a pattern is 100 nm or less, the intermediary layer 102a preferably has a thickness of 50 nm or less including that of the base layer, and the surface roughness Ra of 10 nm or less. More preferably, the total thickness of the intermediary layer 102a and the base layer is 10 nm or less, and the surface roughness Ra is 2 nm or less. Accordingly, the thickness of the base layer including the intermediary layer is a half or less of the height of the pattern, and more preferably is a quarter or less of the height of the pattern. In addition, the surface roughness Ra of the base layer including the intermediary layer is preferably one-tenth or less with respect to the height of the pattern.

A resist 103 is an object to which a fine pattern formed on a mold 100 is transferred. A photo-curable resin is most preferably used for the resist 103. This photo-curable resin is not limited in particular, but may be a well-known resin such as a radical polymerization type, a cationic polymerization type and an anionic polymerization type. A photo-reactive resist added with an initiator may be used.

Preferred photo-curable resins specifically include: benzyl (meth)acrylate, cyclohexyl (meth)acrylate, cyclopentanyl (meth)acrylate, cyclopentenyl(meth)acrylate, adamantyl (meth)acrylate or the like. In addition, the preferred photo-curable resins preferably include ethoxylated bisphenol A di(meth)acrylate. Furthermore, an ethoxylated bisphenol A di(meth)acrylate having ethoxy units of 4 to 17 by number in the structure is particularly preferable because of having a low viscosity. These (meth)acrylate materials can be applied solely or in combination of a plurality of (meth)acrylates. In addition, other than the above described monomer, a (meth) acrylate oligomer formed of these monomers being polymerized can be applied. The photo-curable resin also preferably includes a fluorine compound or a silicon-based compound so as to promote the release of the mold 100 from a resist 104. When the photo-curable resin is used for the resist 103, at least one of the mold 100 and a substrate 102 needs to be sufficiently transparent with respect to a light to be used in a curing operation, and a light irradiation mechanism needs to be incorporated in a nanoimprint apparatus. On the other hand, a thermoplastic resin, a thermosetting resin, a highly viscous resin or the like can be used for the resist 103. In this case, the mold 100, the substrate 102 and the nanoimprint apparatus corresponding to each resist 103 need to be used.

A method of applying the resist 103 can employ, for instance, an ink-jet technique, a dispensing technique and a screen printing technique. In any technique, the resist 103 is instilled drop-wise on the surface of the substrate 102 or the mold 100. And the instilled resist 103 spreads to the surfaces of the mold 100 and the substrate 102 by being pressurized toward the mold 100. A position on which the resist 103 is instilled drop-wise is preferably a plurality of spots, and the center-to-center distance between the instilled spots is set wider than the diameter of the resist 103. The position on which the resist 103 is instilled drop-wise may be determined based on the previously evaluated result on a spreading state of the resist 104 after having been cured, which is located in a position corresponding to a section 101 for forming an asperity geometry, in order that the resist 104 after having been cured can cover the section 101 for forming the asperity geometry without leaving gaps. When droplets of a discharged resist contact with an intermediary layer 102a, the droplets of the resist spread on the intermediary layer 102a while being wet, due to a difference between the surface tension of the resist and the interfacial tension of the intermediary layer 102a. When the space between the droplets of the resist disposed on the intermediary layer 102a is 2R or less, the droplets of the discharged resist 103 aggregate after having contacted with the intermediary layer 102a.

An amount of the droplets of the resist to be applied on the surface of the intermediary layer 102a per one droplet is preferably 0.005 pl or more but 100 pl or less; and more preferably is 0.01 pl or more but 50 pl or less. When the amount of the droplets of the resist to be applied per one droplet is 0.005 pl or less, a diameter of the droplets of the resist is small, which makes the position control by an ink-jet technique difficult. On the other hand, when the amount of the droplets of the resist to be applied per one droplet is 100 pl or more, the base layer tends to be formed in ununiform thickness when the mold 100 presses and spreads the resist 103 after having been brought into contact with the resist 103.

The substrate 102 onto which a fine pattern has been transferred in the above described embodiment can be applied to an information recording medium such as a magnetic recording medium and a photorecording medium. The substrate 102 can be also applied to a large scale integration circuit component, an optical component such as a lens, a polarizing plate, a wavelength filter, a light emitting device and optical integration circuit, and a biodevice for use in immune assay, DNA separation, cell culture and the like.

Next, the present invention will now be described more specifically below with reference to examples.

Example 1

In the present example, a groove structure was formed in a disc substrate.

An employed substrate 102 was a discoid glass substrate having a diameter of 65 mm, a thickness of 0.6 mm, and a diameter of the center hole Hb of 20 mm. The edge part of the periphery and the edge part of the center hole in the substrate 102 were previously chamfered by a width of 0.15 mm. The substrate 102 was immersed in a solution containing 1% of phenethyl trimethoxysilane in a solvent of 2-propanol, and was heated therein at 70° C. for 1 hour. Subsequently, the substrate 102 was cleaned with 2-propanol twice, was dried, and then was dried at 120° C. for 10 minutes to obtain an intermediary layer 102a thereon with a film thickness of 1.2 nm. A resin material 103 was instilled drop-wise on the surface of the substrate 102 with an ink-jet technique right before a nanoimprint operation. The resin was an acrylate-based photo-curable resin to which a photosensitive material was added, and had a viscosity of 4 mPas. 512 Nozzles (256×2 lines) were arrayed, and approximately 50 μl per one droplet of the resin material 103 was applied onto the substrate 102 with the use of an application head for discharging a resin with a piezo mechanism.

A quartz substrate having the same shape as the substrate 102 was used as a mold. A plurality of grooves was concentrically engraved on the surface of the mold facing to the substrate 102, by a well-known electron-beam (EB) direct writing technique. The grooves had a width of 50 nm, a depth of 100 nm and a pitch of 100 nm. The grooves were formed so that the center axis can be aligned with the center axis of the mold.

FIG. 5 is a schematic view illustrating an exemplary process according to the present example. A silicone rubber layer with a thickness of 0.5 mm, which is a buffer layer 108, is provided on an upper surface of a lower stage 106 that can move up and down in a nanoimprint apparatus and is made from stainless steel. An upper stage 107 of the nanoimprint apparatus is made of a quartz plate with a thickness of 20 mm, and a mold 100 is installed so that its section 101 for forming an asperity geometry can face to the lower stage 106. A substrate 102 on which a resin material 103 had been applied was placed on the buffer layer 108 of the lower stage 106, the nanoimprint apparatus was depressurized to a reduced-pressure atmosphere (approximately 0.01 atmospheric pressure), the lower stage 106 was raised so that the substrate 102 could be pressed to the mold 100 at a pressure of approximately 1 MPa, and the resin material 103 was irradiated with ultraviolet rays (with intensity of 100 mW/cm$^2$) emitted from a high-pressure mercury lamp (not shown) for 20 seconds. Subsequently, the lower stage 106 was lowered, and the mold 100 was separated from the substrate 102. Then, a fine geometry made from a pressed and spread resin material 104 was formed on the substrate 102. This nanoimprint process was conducted on the above described substrate 102 and the substrate 102r which was prepared as a comparative example.

Figure 6:
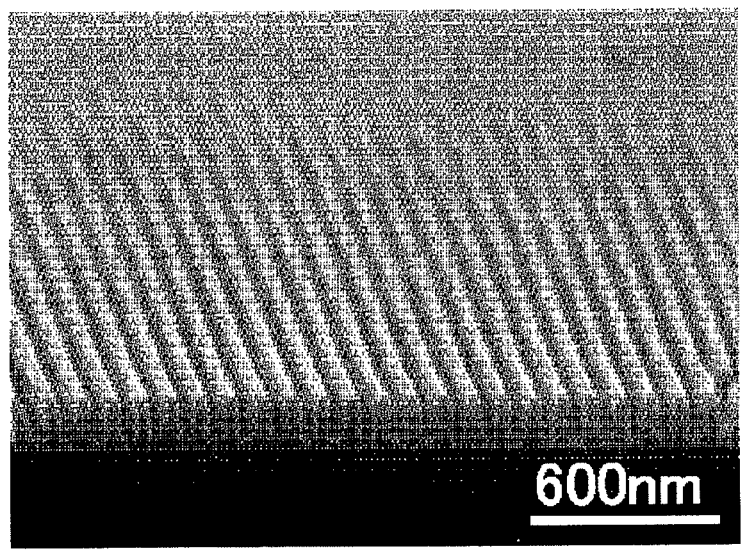
FIG. 6 is an electron microscope photograph of a groove structure.

As a result of having evaluated the fine geometry in the pressed and spread resin material 104 on the substrate 102 through an atomic force microscope, a groove geometry having a width of 50 nm, a depth of 100 nm and a pitch of 100 nm was formed on the substrate 102 having the intermediary layer 102a formed thereon. FIG. 6 is an electron microscope photograph of a groove structure. It was also confirmed that values of a base layer 105 were within the range of 22 nm in average thickness and 10 nm in surface roughness Ra in any place and that the base layer 105 was sufficiently uniform. On the other hand, the fine geometry formed on the substrate 102r prepared as the comparative example showed the same groove geometry having a width of 50 nm, a depth of 100 nm and a pitch of 100 nm. However, it was confirmed that the base layer 105 showed an average thickness of 52 nm and a surface roughness Ra of 45 nm, and that the uniformity of the base layer is different according to the presence or absence of the intermediary layer 102a on the base layer 105. According to the above described example, an effect of the intermediary layer 102a on the base layer was confirmed. By the way, the thickness of the base layer 105 is generally preferably a half or less of the height of the projecting part, though depending on the etching resistance and the etching process of the pressed and spread resin material 104, in the case of etching the backing substrate 102 while using the pressed and spread resin material 104 as a mask. The thickness of the base layer 105 is more preferably set to be a quarter or less of the height.

Example 2

An intermediary layer was formed with the use of various silane coupling agents in a similar procedure to that in Example 1, and the fine geometry was imprinted onto the resist. The results on the film thickness and the surface roughness Ra of the base layer will now be described below. Specifically, the silane coupling agent expressed by the following chemical formula was used.

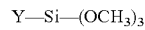 (Chemical Formula 2)

At first, an intermediary layer 102a was formed on the surface of a substrate of a quartz disc having a smooth surface, and the contact angle against water was evaluated. Then, the intermediary layer 102a was formed on the substrate of the quartz disc, the pattern was imprinted thereon, and the thickness of the base layer and the surface roughness Ra were evaluated. The results are shown in Table 1. In Table 1, the thickness of the base layer and the surface roughness Ra are values including the thickness of the intermediary layer 102a.

[Table 1]

TABLE 1

Result of imprinting with the use of silane coupling agent for intermediary layer

| Intermediary layer | Contact angle (degree) | Thickness (nm) of base layer | Ra (nm) |
|---|---|---|---|
| No intermediary layer | 4 | 52 | 42 |
| 3-aminopropyltrimethoxysilane | 21 | 42 | 41 |
| 3-glycidoxypropyltrimethoxysilane | 58 | 28 | 13 |
| 3-acryloxypropyltrimethoxysilane | 67 | 17 | 8 |
| 3-methacryloxypropyltrimethoxysilane | 72 | 14 | 11 |
| phenethyltrimethoxysilane | 77 | 22 | 10 |
| phenyltrimethoxysilane | 93 | 39 | 24 |
| tridecafluoro-1,1,2,2-tetrahydrooctyltrimethoxysilane | 106 | — | — |

When the substrate had the intermediary layer formed thereon, the thickness of the base layer and the surface roughness could be decreased as compared to a substrate having no intermediary layer formed thereon. However, when tridecafluoro-1,1,2,2-tetrahydrooctyltrimethoxysilane was used as the intermediary layer, the thickness of the base layer and the surface roughness could not be measured because the resist was peeled from the substrate.

When 3-aminopropyltrimethoxysilane having a small contact angle against water was used as the intermediary layer, and the pattern was transferred on the disc substrate, the thickness of the base layer was 42 nm, and the surface roughness Ra was 41 nm. Thus, the thickness of the base layer was ununiform. When 3-glycidoxypropyltrimethoxysilane, 3-acryloxypropyltrimethoxysilane, 3-methacryloxypropyltrimethoxysilane and phenethyltrimethoxysilane were used as the intermediary layer, the height of the base layer was an approximately quarter of the height of the projecting part, which was an adequate result. When phenyltrimethoxysilane was used as the intermediary layer, the thickness of the base layer was 39 nm and the surface roughness Ra was 24 nm. This was thought to be because the droplet did not sufficiently spread in an imprinting step to have increased the film thickness though phenyltrimethoxysilane had a large interfacial tension. On the other hand, when tridecafluoro-1,1,2,2-tetrahydrooctyltrimethoxysilane was used, the resist 104 was peeled from the substrate 102 and the thickness of the base layer and the surface roughness Ra could not be measured. The reason is thought to be that an adhesion between the resist 104 and the substrate 102 was decreased because tridecafluoro-1,1,2,2-tetrahydrooctyltrimethoxysilane has a large interfacial tension but a small surface energy.

Example 3

Different amounts per one droplet of a resist 103 were instilled drop-wise on the substrate by an ink-jet technique in a similar procedure to that in Example 1, and the fine geometry was imprinted onto the resist. The results on the film thickness and surface roughness Ra of the base layer will now be described below. Table 2 shows the results of the film thickness and surface roughness Ra of the base layer formed by changing the instilled amount per one droplet of the resist 103.

[Table 2]

TABLE 2

Imprint result when instilled amount per one droplet was changed

| Instilled amount per one droplet (pl) | Thickness (nm) of base layer | Ra (nm) |
|---|---|---|
| 0.001 | 27 | 46 |
| 0.005 | 19 | 21 |
| 50 | 22 | 10 |
| 100 | 28 | 12 |
| 500 | 56 | 82 |

When the instilled amount per one droplet of the resist 103 was 0.001 pl, the thickness of the base layer was 27 nm, the surface roughness Ra was 46 nm, and the base layer 105 caused thickness distribution therein. This was thought to be because the droplets were too small, it was difficult to control the positions by the ink-jet technique, and the droplets aggregated. When the instilled amount per one droplet of the resist 103 was 0.005 pl, 50 pl and 100 pl, the height of the base layer was an approximately quarter of the height of a projecting part, which was adequate. When the instilled amount per one droplet of the resist 103 was 500 pl, the thickness of the base layer was 56 nm, the surface roughness Ra was 82 nm, and the base layer 105 caused thickness distribution therein. This is thought to be because the instilled amount per one droplet was too great and the droplets ununiformly spread.

Example 4

In the present example, a method for manufacturing discrete track media using an imprint lithography according to the present invention will now be described below with reference to the drawings as appropriate. In the drawings to be referred, FIG. 7 is a schematic view illustrating a recording medium according to the present example.

The configuration of the magnetic recording medium will now be described below, with reference to FIG. 7. FIG. 7 illustrates a schematic view of so-called discrete track media (DTM) having each recording track magnetically separated from each other, but a process shown in the present example can be applied to bit patterned media (BPM) which have each recording bit separated from each other.

Figure 7:
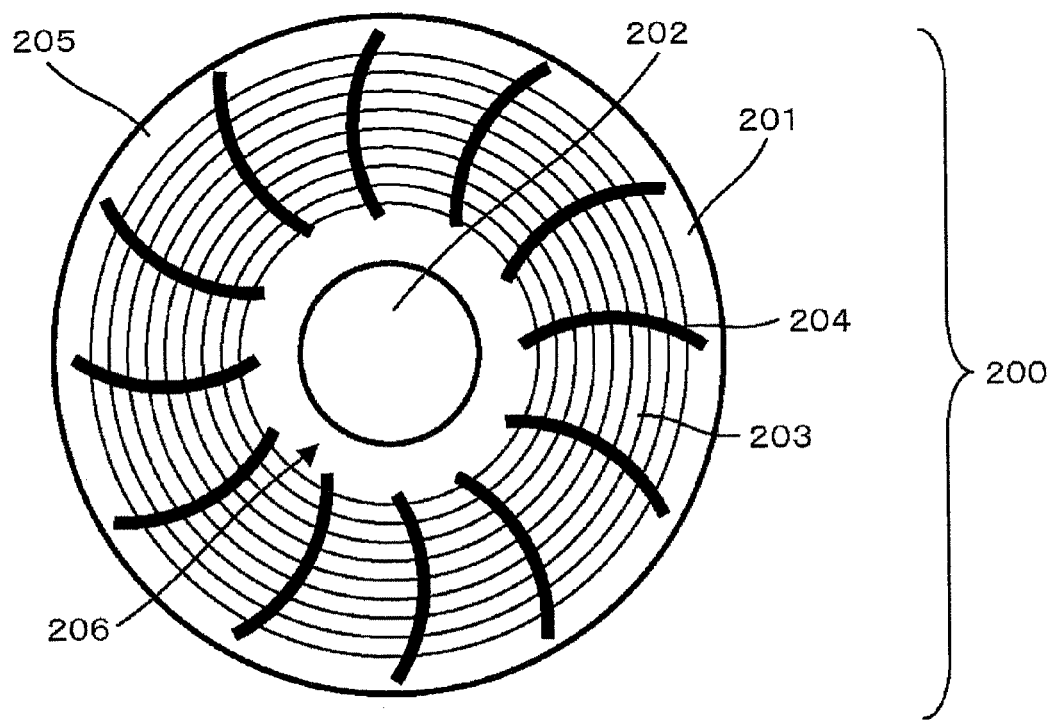
FIG. 7 is a schematic view illustrating a magnetic recording medium to be shown in Example 2.

FIG. 7 is a schematic view illustrating a magnetic recording medium 200 produced by a method according to the present invention. The magnetic recording medium 200 is a disk with a diameter of 65 mm and a thickness of 0.631 mm, and has a structure in which a plurality of magnetic layers and other layers are stacked on a substrate 201. The substrate 201 has a hole 202 with a diameter of 20 mm provided in its center so as to fix the magnetic recording medium 200 around a spindle.

A recording track 203 is concentrically formed, and forms a structure of being magnetically separated from an adjacent track by a non-magnetic material. The top surface of the magnetic recording medium 200 is flattened, so that a difference in height between the recording track 203 and a non-magnetic material region is less than 5 nm. A center-to-center distance between the adjacent recording tracks 203, that is to say, a track pitch (Tp) needs to be determined according to recording density. However, in the present example, the Tp is 150 nm in the central part. The Tp is changed according to a radius value of a disc on the magnetic recording medium 200. This is because the Tp needs to correspond to a yaw angle originating in that a read/write head is driven by a rotary actuator in a hard disk drive (HDD). When a linear actuator is employed so as to drive the read/write head, a uniform Tp may be adopted regardless of the radius value.

The magnetic recording medium 200 has also a servo pattern 204 formed thereon so that the read/write head can access to a region on a desired track and execute reading or writing of information on the region. FIG. 7 illustrates the servo pattern 204 schematically as a curve, but a fine pattern exists inside the servo pattern. This pattern structure will be described later. In the present example, one lap was divided into 200 areas, and the servo patterns 204 were formed so as to enter their respective areas. The number of the servo patterns is not limited to 200 pieces, of course, but the number needs to be determined according to read/write characteristics.

The magnetic recording medium 200 can have an inner circumference 205 and an outer circumference 206 provided thereon, on which the recording track 203 and the servo pattern 204 are not formed.

Figure 8:
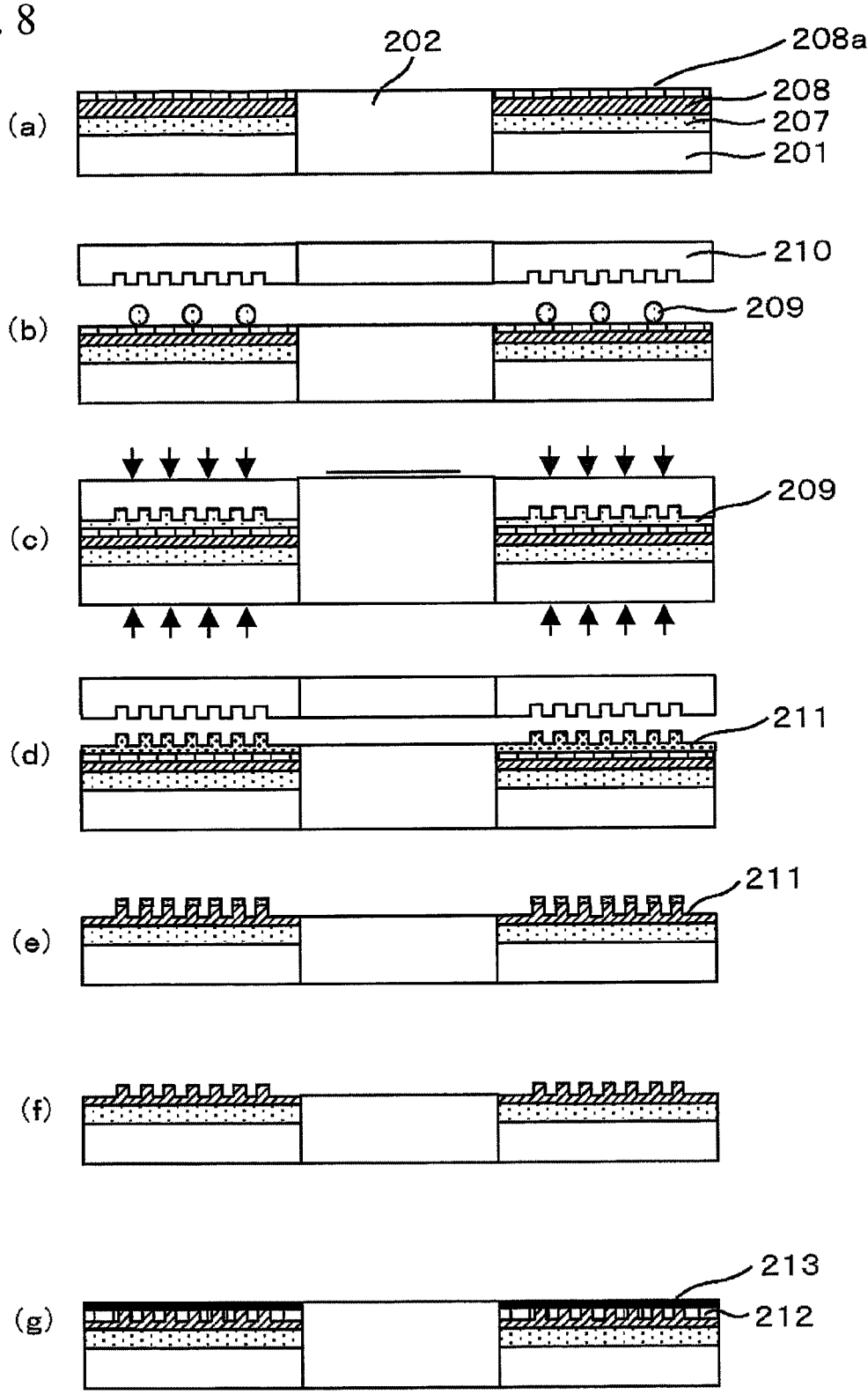
FIG. 8 is a schematic view illustrating a process of forming a magnetic recording medium to be shown in Example 2.

A process for manufacturing the present medium will now be described with reference to FIG. 8. In the manufacturing process, at first, a soft magnetic underlayer 207 (SUL) was grown on a substrate 201. The material of the substrate 201 is not limited to glass, but can be selected from among a metal such as aluminum, a semiconductor such as silicon, and an insulator such as a ceramic and polycarbonate. An Fe—Ta—C alloy was adopted for the soft magnetic underlayer 207, was vapor-deposited by a sputtering technique in a vacuum chamber, and was subjected to necessary heat treatment. Magnetic anisotropy is preferably imparted to the soft magnetic underlayer 207 in a radial direction of the medium. In place of the Fe—Ta—C alloy, a different soft magnetic underlayer 207 may be used, and another growing method can be adopted other than the sputtering vapor-deposition technique. In addition, an adhesion layer may be inserted between the substrate 201 and the soft magnetic underlayer 207 so as to enhance the adhesion between them, or an intermediary layer or the like may be inserted between them so as to control the crystallinity of the soft magnetic underlayer 207, as needed. After the soft magnetic underlayer 207 had been formed, the recording layer 208 was sequentially grown in a vacuum by a sputtering vapor-deposition technique. In the present example, a Co—Cr—Pt film was adopted for the recording layer 208. The material has its peculiarity of having an easily magnetizable axis in a direction perpendicular to a film face. Accordingly, in the present example, a condition of sputtering vapor deposition was selected such that the axis of the magnetic anisotropy was approximately perpendicular to the substrate face. A magnetic material to be used for the recording layer 208 is not limited to the Co—Cr—Pt alloy, but other materials may be used. Particularly, a recording layer 208 containing silicon referred to as a granular film is compatible with the present invention. Furthermore, an intermediary layer 208a was formed as was described in Example 1. According to the above process, the substrate 201 as illustrated FIG. 8(A) was formed.

Subsequently, nanoimprint steps illustrated in FIGS. 8(B), 8(C) and 8(D) are carried out. In these figures, a nanoimprint apparatus is omitted for simplification. Steps from the next step to the end of a photo-curing step are performed under ultraviolet protection. An acrylate-based photo-curable resin (hereinafter referred to as a resist 209), to which a liquid photosensitive material is added, is applied on a flat structure completed by the above described process. In the present example, the resist 209 was applied by using the ink-jet technique described in Example 1.

A substrate 201 on which the resist 209 has been applied in this way is arranged on a lower stage in the nanoimprint apparatus so that the surface on which the resist has been applied, turns up, as is illustrated in FIG. 8(B). In addition, a mold 210 having a diameter of 65 mm and a thickness of 1 mm is arranged on an upper stage of the nanoimprint apparatus so that the surface of the substrate 201 having the resist applied thereon faces to the surface of the mold 210 having an asperity geometry formed thereon. In the present example, quartz is employed as a material of the mold 210, but other materials may be employed as long as the material can transmit a light having a necessary wavelength for curing the resist 209 therein. In the present example, the mold 210 also has a center hole 202 formed therein with the same diameter of 20 mm as that of the substrate. The center position of the mold 210 was aligned to that of the substrate 201 mechanically with the use of the center hole 202. However, a feedback mechanism using an optical measurement may be used as needed, though it was not used in the present example. A transferring mechanism to be used for alignment can move in a horizontal plane and in a vertical direction, rotate, and correct tilt. The mold 210 has an asperity geometry formed thereon which corresponds to and has a mirror image relationship with a recording track 203 and a servo pattern 204 formed on a magnetic recording medium 200 as described above. All recess parts on the present mold 210 are formed so as to be 100 nm deep.

After the positioning had been finished, the mold 210 was brought into contact with the substrate 201 at a pressure of 0.9 MPa, and then the substrate 201 was irradiated with a light, as is illustrated FIG. 8(C). In the present example, a high-pressure mercury lamp of 100 mW/cm$^2$ was used as a light source. The amount of irradiation depends on the type of a resist 209, but was 0.3 mJ/cm$^2$ in the present example. The value needs to be changed according to the type of the resist 209 to be used and the irradiation condition. The light intensity was controlled so as to attain the required energy by adjusting an irradiation duration time on the basis of previously measured data. Needless to say, the dose of light may be measured by installing a photodetector in a chamber and making the photodetector monitor the amount of the light in real time. After the resist has been photo-cured, the mold 210 was released from the substrate 201 by vacuum-sucking the mold 210 and the substrate 201 from their respective rear surfaces, and applying a tensile stress in a direction perpendicular to the surface of the substrate 201, as is illustrated in FIG. 8(D). According to the present step, a cured resist 211 was formed on the substrate 201.

Subsequently, a disc was taken out from the nanoimprint apparatus, and was milled with ions from above by using an ion milling apparatus. Ar was used as an ion species in the present example, but other ion species may also be used. The pattern may be transferred by a reactive ion etching (RIE) technique, a wet etching technique or the like instead of the ion milling technique. According to the step, the whole cured resist 211 is made into a thin layer, and a recording layer 208 that is in a lower side of the region in which the film thickness of the cured resist 211 is small is removed by argon ion exposure. According to the step, the asperity geometry of the cured resist 211 is formed on the recording layer 208 as is illustrated in FIG. 8(E). In addition, it is preferable for improving the pattern accuracy to previously etch the cured resist 211 with oxygen plasma prior to the ion milling step and thereby remove the region in which the film thickness of the cured resist 211 is small so that a magnetic film 208 in a lower side can be directly exposed to the argon ion in the following ion milling step, though the etching technique was not employed in this step.

Then, a recording layer 208 having an asperity geometry illustrated FIG. 8(F) can be formed by removing the cured resist 211 in a rinsing step. Afterward, a non-magnetic material 212 is embedded in a groove part as needed. For instance, Si—O can be grown from the upper part of the substrate, and be flattened by an etchback technique or a chemical machinery polishing (CMP) process. A protection film 213 or a lubricant film (not shown) is grown on the flattened surface as further needed, and a magnetic recording medium 200 is completed as is illustrated in FIG. 8(G). In the present example, the intermediary layer 208a is formed on the recording layer 208 to make the distribution of the base layer thickness uniform, which has enabled a high-accuracy processing.

In addition, the recording layer 208 is formed by a nanoimprint process in the present example, but it is also possible to form the asperity geometry on the substrate 201 by the nanoimprint process similarly to the above described method, and grow the magnetic film in each of the asperities from the surface of the asperity geometry of the substrate 201.

Example 5

In the present example, an optical information processing apparatus manufactured by using an imprint lithography according to the present invention will now be described below.

An object to be solved according to the present invention is to uniformize the distribution of a base layer formed in a nanoimprint process, which is important when the nanoimprint process is applied to the manufacture of the optical information processing apparatus.

Figure 9:
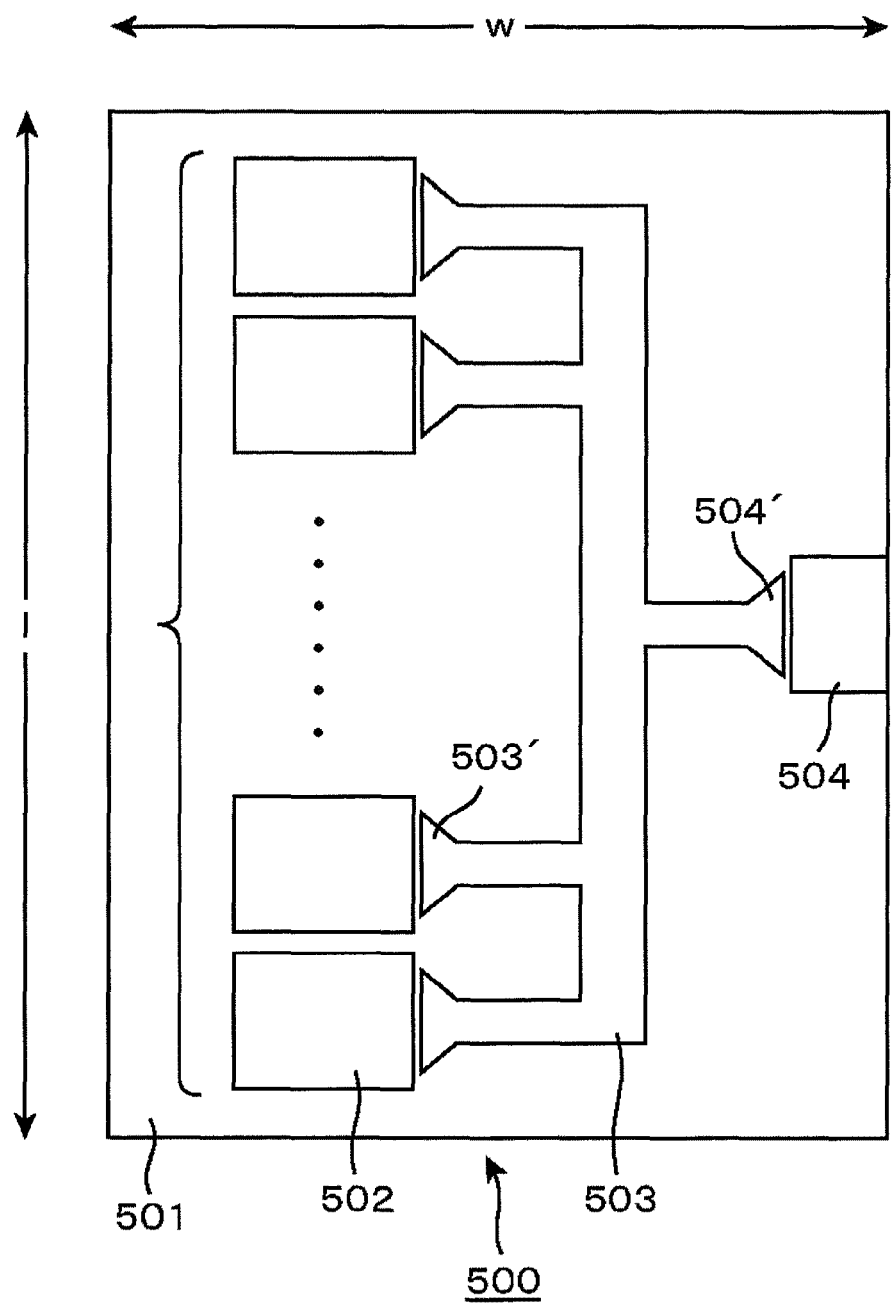
FIG. 9 is a schematic block diagram of an optical circuit which is a basic component of an optical device.
Figure 10:
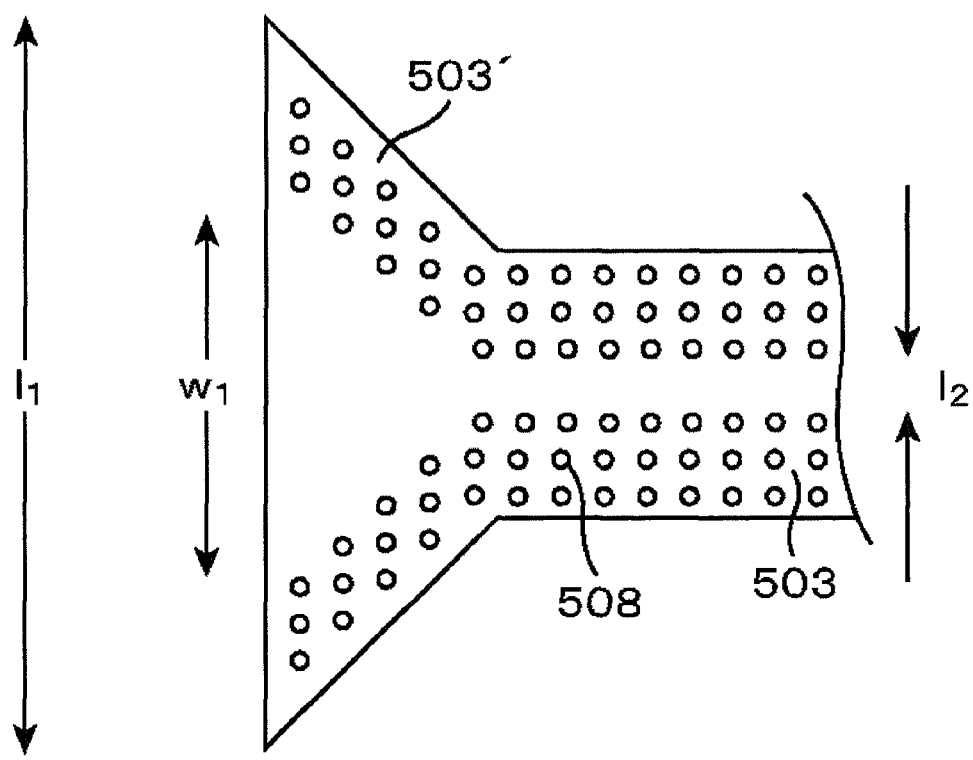
FIG. 10 is a schematic view illustrating a structure of a waveguide of an optical circuit.

In the present example, one example will be described in which an optical device whose incident light changes its traveling direction is applied to an optical information processing apparatus of an optical multiplex communication. FIG. 9 is a schematic block diagram of an optical circuit which is a basic component of an optical device. FIG. 10 is a schematic view illustrating a structure of a wave guide of the optical circuit.

As is illustrated in FIG. 9, an optical circuit 500 was formed on the substrate 501 which was made from aluminum nitride and had a length (l) of 30 mm, a width (w) of 5 mm and a thickness of 1 mm. The optical circuit 500 comprises a plurality of transmission units 502 which includes an indium phosphorus-based semiconductor laser and a driver circuit, light guides 503 and 503', and optical connectors 504 and 504'. The transmission wavelengths of the plurality of the semiconductor lasers are set so that they are different from each other by 2 to 50 nm.

In the optical circuit 500, an optical signal inputted from the transmission unit 502 is transmitted from the optical connector 504' to the optical connector 504 through the waveguide 503' and the waveguide 503. In this case, the optical signals transmitted from each waveguide 503' are multiplexed.

As is illustrated in FIG. 10, a plurality of columnar fine projections 508 are provided inside the waveguide 503. The input section of the waveguide 503' has a width (l1) of 20 μm and has a trumpet shape when viewed from a horizontal cross-section so that an alignment error between the transmission unit 502 and the waveguide 503 can be tolerated. Only one row of the columnar fine projections 508 is removed in the central part of a straight part which forms the waveguide 503. In other words, a region free from a photonic band gap is formed there, and a signal light is thereby led to a region (W1) with a width of 1 μm. The space (pitch) between the columnar fine projections 508 is set at 0.5 μm. FIG. 10 illustrates a less number of the columnar fine projections 508 than the real number, for the sake of simplification.

The photo nanoimprint lithography according to the present invention is applied to the waveguides 503 and 503', and to the optical connector 504'. Specifically, the imprint lithography according the present invention is applied to a step of forming predetermined columnar fine projections 508 in a predetermined transmission unit 502, when forming the columnar fine projections 508 in the transmission unit 502. By the way, the optical connector 504' has a structure in which the waveguide 503' in FIG. 10 is reversed as regards right and left. The columnar fine projections 508 in the optical connector 504' are arranged to be reversed as regards right and left with respect to the columnar fine projections 508 in FIG. 10.

Here, the equivalent diameter (diameter or one side) of the columnar fine projection 508 can be set arbitrarily in a range of 10 nm to 10 μm according to a relationship with a wavelength of a light source to be used in a semiconductor laser or the like. The height of the columnar fine projection 508 is preferably 50 nm to 10 μm. The space (pitch) between the columnar fine projections 508 is set at approximately a half of the wavelength of a signal to be used.

Such an optical circuit 500 can output a signal light in which a plurality of different wavelengths is multiplexed. However, the optical circuit 500 can change a traveling direction of the light, and accordingly can control the width (w) of the optical circuit 500 into such an extremely short value as 5 mm. Therefore, the optical device can be downsized. The imprint lithography can also form the columnar fine projections 508 by transferring the pattern thereon from the mold, and accordingly can reduce the manufacturing cost of the optical circuit 500. In the present example, an example was described in which the photo nanoimprint lithography according to the present invention is applied to the optical device in which the input lights are multiplexed, but the photo nanoimprint lithography according to the present invention is useful for all optical devices which control a path of light.

What is claimed is:

1. A photo nanoimprint lithography comprising the steps of:
   discretely applying a photo-curable resist drop-wise onto a substrate;
   filling a first asperity pattern of a mold with the photo-curable resist by bringing the mold having the first asperity pattern formed therein into contact with the photo-curable resist;
   curing the photo-curable resist by irradiating the resist with a light;
   releasing from the mold the photo-curable resist which has been photo-cured to form a second asperity pattern on the photo-curable resist, which has been photo-cured; and
   forming an intermediary layer which has a larger interfacial tension than the surface tension of the photo-curable resist on a surface of the substrate and has a predetermined thickness before the step of discretely applying the photo-curable resist drop-wise onto the substrate,
   wherein the thickness the intermediary layer is determined so as to be commensurate with the etching resistance of the resist and the thickness of a base layer, with the thickness of the base layer including the intermediary layer being half or less than a half of the height of the second asperity pattern of the photo-curable-resist, wherein the intermediary layer is combined with the surface of the substrate through a chemical bond, wherein a functional group to be combined with the surface of the substrate is a silane coupling group.

2. The photo nanoimprint lithography according to claim 1, wherein the intermediary layer has an organic compound containing at least one functional group which forms bonding with the resist through a chemical bond.

3. A photo nanoimprint lithography comprising the steps of:

discretely applying a photo-curable resist drop-wise onto a substrate;

filling first asperity pattern of a mold with the photo-curable resist by bringing the mold having the first asperity pattern formed therein into contact with the photo-curable resist;

curing the photo-curable resist by irradiating the resist with a light;

releasing from the mold, the photo-curable resist which has been photo-cured to form a second asperity pattern on the photo-curable resist, which has been photo-cured; and forming an intermediary layer which has a larger contact angle against water than that of the substrate and has a predetermined thickness before the step of discretely applying the photo-curable resist drop-wise onto the substrate, wherein the thickness the intermediary layer is determined so as to be commensurate with the etching resistance of the resist and the thickness of a base layer, with the thickness of a base layer including the intermediary layer being half or less than a half of the height of the second asperity pattern of the photo-curable resist, wherein the intermediary layer comprises a silane coupling agent shown by the following general formula 1:

$Y_n SiX_{(4-n)}$ (General formula 1), wherein Y represents an alkyl group, a fluoroalkyl croup, a vinyl group, an amino group, phenyl group, a chloroalkyl group, an isocyanate group, or an epoxy group or an organic group comprising them; X represents an alkoxyl group, an acetyl group or a halogen; and n is an integer of 0 to 3.

4. The photo nanoimprint lithography according to claim 3, wherein the intermediary layer has a larger interfacial tension than the surface tension of the photo-curable resist.

5. The photo nanoimprint lithography according to claim 3, wherein the intermediary layer is combined with the surface of the substrate through a chemical bond.

6. The photo nanoimprint lithography according to claim 3, wherein the intermediary layer has an organic compound containing at least one functional group which forms bonding with the resist through a chemical bond.

7. The photo nanoimprint lithography according to claim 3, wherein the step of discretely applying the photo-curable resist drop-wise includes disposing the droplet of the photo-curable resist on a surface of the intermediary layer by an ink-jet technique.

8. The photo nanoimprint lithography according to claim 7, wherein an amount of the droplet discharged by an ink-jet technique in the step of disposing the droplets of the photo-curable resist on the surface of the intermediary layer by the ink-jet technique is 0.005 pl or more but 100 pl or less per one droplet, and a center-to-center distance between the droplets disposed on the surface of the intermediary layer by the ink-jet technique is longer than a length in a longitudinal direction of the droplet.

9. The photo nanoimprint lithography according to claim 3, wherein a thickness of the intermediary layer is a half or less of a height of the asperity pattern.

10. The photo nanoimprint lithography according to claim 1, wherein the intermediary layer is a non-etched layer.

11. The photo nanoimprint lithography according to claim 3, wherein the intermediary layer is a non-etched layer.

* * * * *